(12) United States Patent
Lu et al.

(10) Patent No.: US 6,774,057 B1
(45) Date of Patent: Aug. 10, 2004

(54) METHOD AND STRUCTURE FOR FORMING DIELECTRIC LAYERS HAVING REDUCED DIELECTRIC CONSTANTS

(75) Inventors: Hong-Qiang Lu, Fremont, CA (US); Wei-Jen Hsia, Sunnyvale, CA (US); Wilbur G. Catabay, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/180,661

(22) Filed: Jun. 25, 2002

(51) Int. Cl.[7] .................... H01L 21/31; H01L 21/469
(52) U.S. Cl. .................... 438/783; 638/514; 638/520; 638/522
(58) Field of Search .................... 438/783, 798, 438/514, 520, 522

(56) References Cited

U.S. PATENT DOCUMENTS 6,208,030 B1 * 3/2001 Tsui et al. .................. 257/758
6,346,488 B1 * 2/2002 Kabansky .................. 438/783

* cited by examiner

*Primary Examiner*—Alexander Ghyka
(74) *Attorney, Agent, or Firm*—Beyer, Weaver & Thomas, LLP

(57) ABSTRACT

The present invention is directed to a semiconductor structure including a semiconductor substrate having at least one overlying layer formed thereon. The at least one overlying layer including at least one layer of dielectric material. The at least one layer of dielectric material including a protected region having a first dielectric constant and another porous region having a second dielectric constant wherein the value for the second dielectric constant is less than the first dielectric constant. The porous region having been formed by the implantation of a porosity inducing material into the porous region and subsequent annealing. A method for forming such structures is also included.

18 Claims, 4 Drawing Sheets

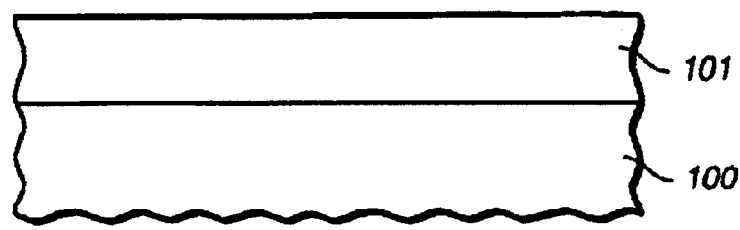
FIG._1a
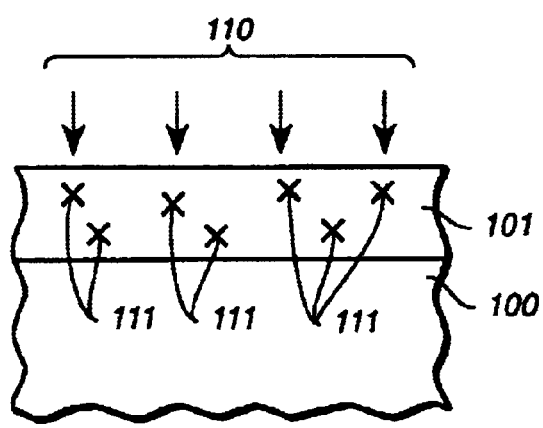
FIG._1b
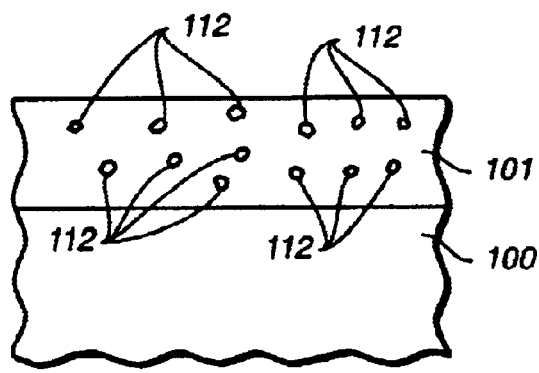
FIG._1c

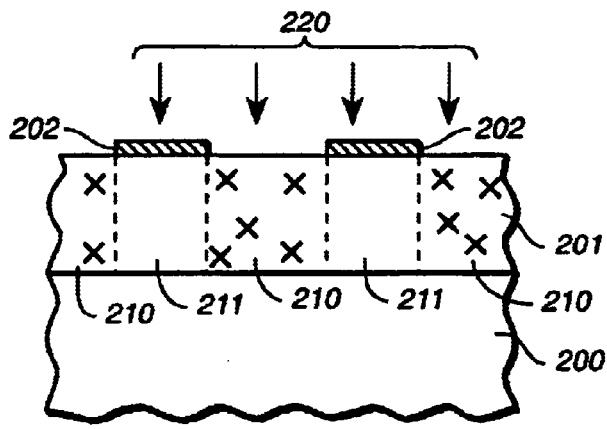
FIG._2a
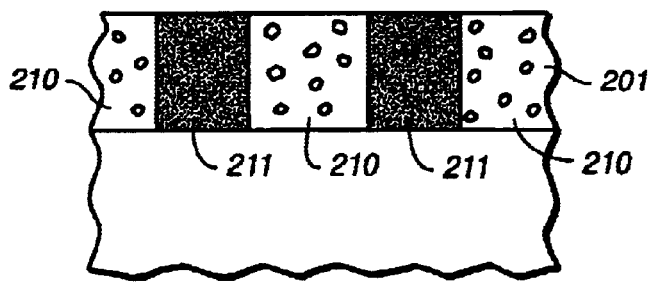
FIG._2b
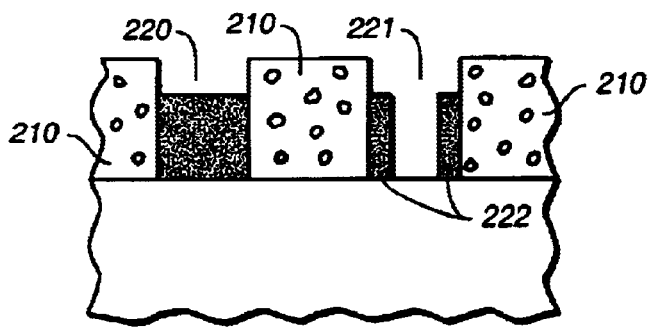
FIG._2c
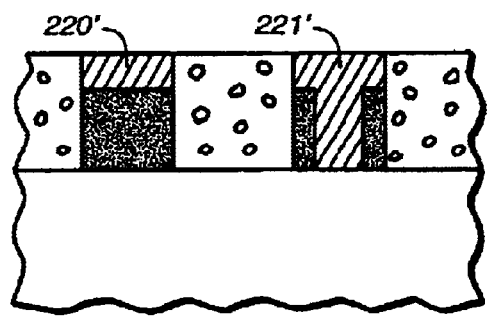
FIG._2d

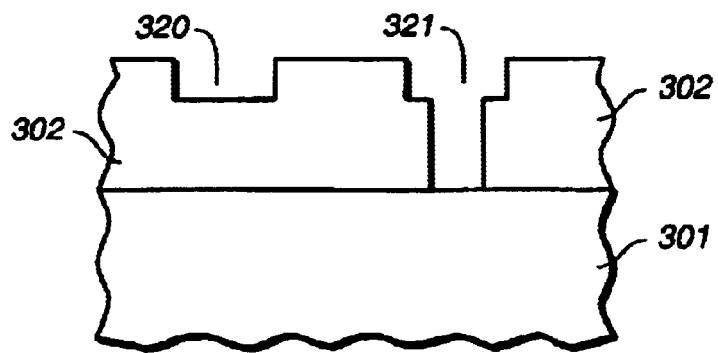
FIG._3a
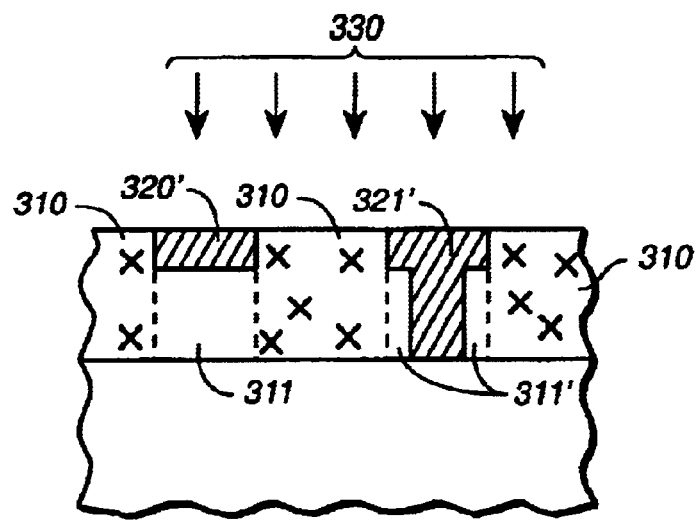
FIG._3b
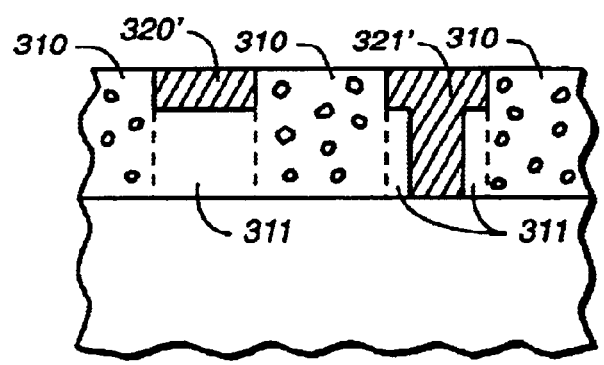
FIG._3c

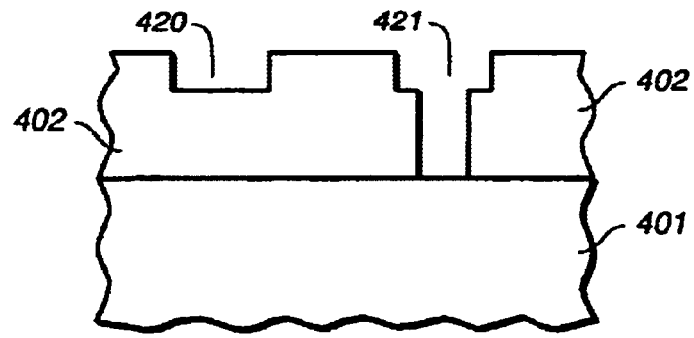
FIG._4a
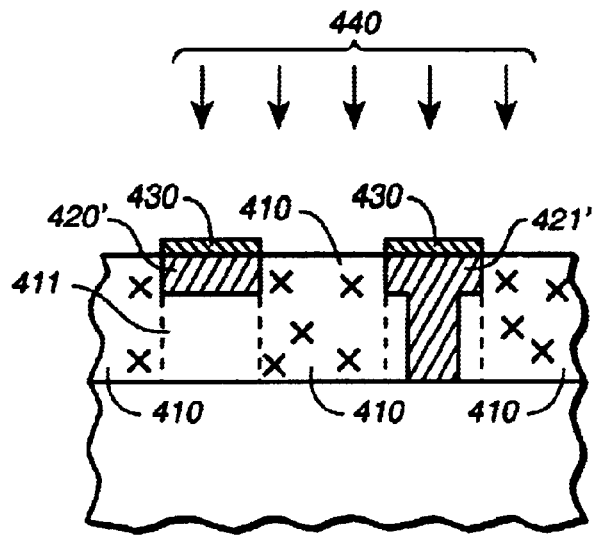
FIG._4b
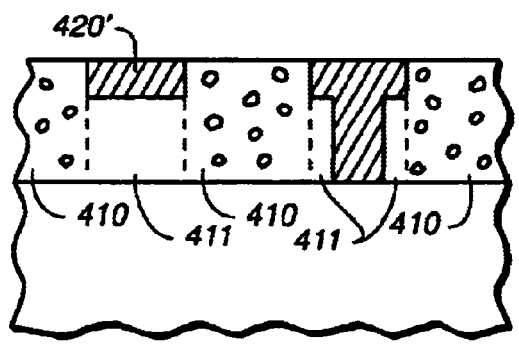
FIG._4c

US 6,774,057 B1

METHOD AND STRUCTURE FOR FORMING DIELECTRIC LAYERS HAVING REDUCED DIELECTRIC CONSTANTS

FIELD OF THE INVENTION

The invention described herein relates generally to semiconductor devices and processing. In particular, the present invention relates to methods, materials, and structures used in semiconductor fabrication processes that result in dielectric layers having porous regions of lowered dielectric constant K.

BACKGROUND OF THE INVENTION

As greater and greater circuit densities are sought in semiconductor fabrication, metal interconnections are becoming more numerous and closer together. The increased circuit and interconnect densities can result in undesirable cross-talk problems and greater RC interconnect delays. These RC delays are becoming a more important factor in limiting chip performance. This puts additional demands on the dielectric layers used to electrically isolate the metal interconnects and circuit element from one another. One way to address the RC delay problem is to lower C (capacitance) in the circuit. One approach to achieving lowered capacitance is to incorporate dielectric materials having a lower dielectric constant (κ). Existing methods for reducing capacitance include the implementation of specialized low-κ materials to create electrical isolation regions on semiconductor wafers. But, as circuit and interconnect density increases there is a need for materials and structures that have even lower dielectric constants.

To achieve these goals, dielectric structures having reduced dielectric constants and new methodologies for their fabrication are needed.

SUMMARY OF THE INVENTION

In accordance with the principles of the present invention, methods and structures for an improved dielectric layer are disclosed. One embodiment of the present invention is directed to a semiconductor structure including a semiconductor substrate having at least one overlying layer formed thereon. The at least one overlying layer including at least one layer of dielectric material. The at least one layer of dielectric material including a protected region having a first dielectric constant and another porous region having a second dielectric constant wherein the value for the second dielectric constant is less than the first dielectric constant. The porous region having been formed by the implantation of a porosity inducing material into the porous region and subsequent annealing.

Another embodiment of the invention includes a method for forming such structures. The method includes the steps of providing a semiconductor substrate having at least one overlying layer that includes a layer of dielectric material having a first dielectric constant formed thereon. Implanting a portion of the dielectric layer with a porosity inducing agent to form porosity regions. Annealing the semiconductor substrate to form micro-pores in the implanted porosity regions, the annealed porosity regions having a second dielectric constant having a lower numerical value than a numerical value for the first dielectric constant.

These and other attributes of the present invention are disclosed herein.

BRIEF DESCRIPTION OF THE DRAWINGS

The following detailed description will be more readily understood in conjunction with the accompanying drawings, in which:

FIGS. 1(a)–1(c) are cross-section views of a simplified semiconductor wafer subjected to a process embodiment in accordance with the principles of the present invention.

FIGS. 2(a)–2(d) are cross-section views of a simplified semiconductor wafer subjected to another process embodiment in accordance with the principles of the present invention.

FIGS. 3(a)–3(c) are cross-section views of a simplified semiconductor wafer subjected to another process embodiment in accordance with the principles of the present invention.

FIGS. 4(a)–(c) are cross-section views of a simplified semiconductor wafer subjected to another process embodiment in accordance with the principles of the present invention.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, several dielectric layer embodiments and method embodiments will be disclosed. As depicted in FIG. 1 (a), the embodiments begin by first providing a suitable substrate 100 having semiconductor devices and/or structures formed thereon. As used herein, substrate refers to a semiconductor structure. Such structures can include, for example, the bare silicon surfaces of a silicon wafer or any of the surfaces formed thereon. These surfaces can include a number of different layers constructed in accordance with ordinary semiconductor fabrication processes. The substrate 100 has a dielectric layer 101 formed thereon. For the sake of simplicity, only a single dielectric layer 101 is shown. However, it should be appreciated that many other layers of material are typically formed on such substrates 100.

The material forming the dielectric layer 101 can be silicon dioxide; however combinations of silicon dioxide and other doped dielectrics (e.g., BPSG, PSG, FSG) may also be used. Additionally, low-κ dielectric materials or other electrically isolating materials are also used. The principles of the present invention are particularly useful when applied to low-κ dielectric materials (e.g., materials having a dielectric constant κ of less than 3.0). Examples of such materials can include, but are not limited to, spin-on and CVD polymeric materials based on silicon or carbon, or based on combinations of silicon and carbon. Other low-κ materials include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-κ materials include SiCOH or polymers of parylene and napthalene, copolymers of parylene with polysiloxanes or teflon, and polymers of polysiloxane. Other examples of such materials include, but are not limited to, mesoporous silica, silica xerogels, silica aerogels, polyimide nanofoams, as well as other related materials. One typical product useful for such applications is SiLK® available from Dow Chemical.

Referring to FIG. 1(b), a porosity inducing agent is then implanted 110 into the dielectric layer 101 using an ion implantation device. Portions of the dielectric layer 101 so implanted contain a dose of the porosity inducing agent. This dose of porosity inducing agent is schematically depicted by the X's 111. An effective porosity inducing agent comprises materials that are substantially inert with respect to the dielectric material of the dielectric layer 101. Additionally, the porosity inducing agent must be able to be outgassed from the dielectric layer 101 at temperatures that do not damage the dielectric layer 101 or other materials of the substrate (e.g., metal layers, active devices, etc.). The porosity inducing agent must, upon outgassing, leave behind a region of micro-pores in the dielectric layer 101. One effect of these micro-pores is that the dielectric constant of the dielectric material is reduced. In one embodiment, the porosity inducing agent can comprise hydrogen ions ($H^+$ ions). Other suitable porosity inducing agents can include without limitation He, Ar, and $N_2$. The $H^+$ ions are implanted into the dielectric layer 101 at energies ranging from about 0.3 MeV to about 5 MeV. The precise implantation energies being dependent on the material and thickness of the dielectric layer 101. The implantation exposure period is between 1–60 minutes depending on the desired dose. Longer exposure periods cause higher doses. The higher the dose, the greater the number of micro-pores and the lower the κ of the resulting dielectric layer. The dielectric layer 101 is implanted until the implanted ion density (ion dose) reaches a desired level. In one embodiment the ion dose can range from about $10^{13}$–$10^{16}$ $H^+ions/cm^2$.

In one embodiment an Applied Materials 9210 Ion Implanter available from Applied Materials, Inc. of Santa Clara, Calif. can be used to implant a $H^+$ ion dose of $10^{14}$ $H^+$ ions/$cm^2$ into a dielectric layer about 1 μm thick formed of Black Diamond® dielectric material available from Applied Materials, Inc. of Santa Clara, Calif. Such implantation should take about 30 minutes.

Referring to FIG. 1(c), the substrate is then annealed to form porous regions in the dielectric layer 101. Micro-pores 112 are schematically depicted by the dots in the dielectric layer 101. Such annealing should be conducted at temperatures that do not result in damage to the dielectric layer 101 or any of the other layers or structures formed on the substrate 100. Such anneal temperatures range from about 250° C. to about 400° C. Such annealing can be achieved using rapid thermal annealing (RTA), furnace annealing, or other annealing processes that will result in outgassing of the porosity inducing agent from the dielectric layer 101. This outgassing results in the formation of porous regions in the implanted portions of the dielectric layer. In one embodiment, this can be achieved by furnace annealing at about 250° C. to about 400° C. for about 10–30 minutes (m). In one preferred process, annealing occurs for about 15 m at about 350° C. The substrate 100 is now ready for further processing. Such further processing can include, the formation of further dielectric layers and further implantation and annealing in accordance with the principles of the present invention.

FIGS. 2(a)–2(d) address yet another embodiment of the invention. The ion implantation step of the above-described process creates porous regions that are somewhat more delicate than that of an unaffected dielectric layer. It is advantageous to maintain some regions of the dielectric layer in an unaffected (non-porous) state. This has the advantage of providing greater strength and support for other layers of the substrate. The principles of the present invention advantageously provide method embodiments for selectively creating porous regions having lower dielectric constant and maintaining some regions in a non-porous state.

Referring to FIG. 2(a), the embodiment begins by providing a suitable substrate 200 having semiconductor devices and/or structures formed thereon. As above, such structures can include, for example, the bare silicon surfaces of a wafer or any of the surfaces formed thereon. These surfaces can include a number of different layers constructed in accordance with ordinary semiconductor fabrication processes. The substrate 200 has a dielectric layer 201 formed thereon. For the sake of simplicity, only a single dielectric layer 201 is shown. The dielectric layer 201 is pattern masked with a protective layer 202. In one implementation the protective layer 202 comprises a mask material 202 (e.g., photoresist material) patterned to define porosity regions 210 and protected regions 211. Openings in the protective layer 202 define porosity regions 210 and protected regions 211 are covered by the overlying protective layer 202 of the pattern mask. This protective layer 202 protects the protected regions 211 of the dielectric layer 201 from later ion implantation steps. The exposed porosity regions 210 can still be readily treated with ion implantation (and later made porous).

Still referring to FIG. 2(a), the surface of the dielectric layer is ion implanted 220 with a porosity inducing agent. The porosity regions 210 receive a desired dose of the porosity inducing agent. The implanted porosity inducing agent is schematically depicted by the "X's". The implantation process, parameters, and machines are the same as disclosed hereinabove. The protected regions 211 are not implanted because they are protected by the overlying protective layer 202. A number of different materials can be used to form the protective layer 202 that protects the protected regions 211. In general, all that is required of such a protective layer 202 is that it be formed of a material that is substantially un-reactive with the dielectric layer 201 and that it provide a barrier to the implanted porosity inducing agent. In one particular embodiment, a photoresist material can be used to form the protective layer 202. Such a protective layer 202 prevents the implantation of the porosity inducing agent into the protected regions 211.

Referring to FIG. 2(b), the protective layer 202 is removed and the substrate 201 is annealed. The annealing process can be the same as disclosed hereinabove with respect to the discussion of FIG. 1(c). The depicted embodiment includes a dielectric layer 201 having well defined porosity regions 210 and protected regions 211.

Referring to FIG. 2(c), material can be removed from the protected regions. This can be done using a variety of etch techniques known to persons having ordinary skill in the art. In the depicted embodiment, a trench 220 and a via 221 are depicted. The trench 220 can be used to, for example, form electrical interconnect structures. The via 220 can be used to, for example, create electrical connections to underlying circuit elements (not shown here). In the depicted embodiment, the walls 222 of the via 221 have not been implanted with a porosity inducing agent. Therefore, the walls 222 are structurally more robust than the surrounding porosity regions 210. Thus, the walls 222 provide better support for any interconnect materials placed in the via 221. Additionally, the walls 222 make the integration of via and trench filling easier. This is because outgassing from the low-K materials can make via and trench filling operations difficult. Thus, by having less porous walls 222 on the sides of trenches and vias, outgassing is less of a problem in those trench and via regions. Although, the depicted embodiment is shown with trenches and vias, other types of openings can be formed in the dielectric layer.

Referring to FIG. 2(d), conducting materials can be deposited in trenches and/or vias (or other openings) formed in the protected regions of the dielectric layer. In the depicted embodiment, the via 221' is filled with a conducting material. Similarly, the trench 220' is also filled with a conducting material. The conducting material can be formed in the openings using a wide range of materials and techniques known to those having ordinary skill in the art. Such techniques can include, but are not limited to single and double damascene processes. Also, the conducting material may be formed of many materials, including metals or metal alloys. Also, the conducting materials can structured in many different layers. For example, if a copper conducting material is used, barrier layers, seed layers, bulk copper layers, and capping layers can be used to fill the openings in the protected regions of the dielectric layer. Other commonly used conducting materials contemplated by the inventors include, but are not limited to aluminum, aluminum containing compounds, copper, copper containing compounds, silicide materials, tungsten, as well as many other conducting materials known to persons having ordinary skill in the semiconductor processing and fabrication arts.

Another approach is depicted in FIGS. 3(a)–3(c). FIG. 3(a) is a cross-section view of a portion of the surface of the substrate. The depicted substrate has a semiconductor surface 301 having a dielectric layer 302 formed thereon. Material is removed from the dielectric layer 302 to form openings prior to any implantation. In the depicted embodiment, material is removed forming a trench 320 and a via 321.

In FIG. 3(b), conducting material is deposited into the trench and via using conventional processes. As discussed with respect to FIG. 2(d), the conducting material can be formed in the openings using a wide range of materials and techniques known to those having ordinary skill in the art. The deposited trench material 320' and the deposited via material 321' can now serve as a protective layer for the underlying dielectric material. Thus, the space between the deposited trench material 320' and the deposited via material 321' define porosity regions 310. The deposited trench material 320' defines an underlying protected region 311. The deposited via material 321' also defines underlying protected regions 311 that make up the walls of the via. The deposited trench material 320' and the deposited via material 321' protect the underlying protected regions 311 from later ion implantation steps. As before, the exposed porosity regions 310 can still be readily treated with ion implantation (and later made porous). This ion implantation 330 with a porosity inducing material is also depicted in FIG. 3(b). The implanted porosity inducing material is schematically depicted by the "X's" in the porosity regions 310.

Referring to FIG. 3(c), after implantation with the porosity inducing material the substrate is annealed. This annealing is essentially the same as the annealing explained hereinabove. This leaves a resulting structure similar to that of FIG. 2(d). The trench is filled with deposited trench material 320' and the via is filled with deposited via material 321'. The annealing forms micro-pores in the porosity regions 310. As explained above, the walls 311 of the via have not been implanted with a porosity inducing agent.

Also, the protected region 311 underlying the deposited trench material 320' is not implanted with a porosity inducing agent. Therefore, upon annealing, neither of these regions 311 include micro-pores.

In the embodiment of FIGS. 4(a)–4(c), the process is supplemented with the addition of a protective layer over the conducting materials. FIG. 4(a) depicts a cross-section view of a portion of a surface of a substrate similar to that shown in FIG. 3(a). The depicted substrate has a semiconductor surface 401 with a dielectric layer 402 formed thereon. Material is removed from the dielectric layer 402 to form openings. In the depicted embodiment the openings include a trench 420 and a via 421.

In FIG. 4(b), conducting material is deposited into the openings with conventional processes. As discussed with respect to FIG. 2(d) and 3(b), the conducting material can be formed in the openings using a wide range of materials and techniques known to those having ordinary skill in the art. A conducting trench material 420' and a conducting via material 421' are deposited in the openings. In some embodiments it is advantageous to protect the deposited conducting materials from subsequent implantation steps. Therefore, a protective layer 430 is formed over the conducting material 420', 421'. The protective layer 430 can be of the same type of material described hereinabove with respect to FIG. 2(a). Other materials may be used as long as they are suitable (e.g., the protective layer should be formed of a material is that is substantially un-reactive with the conducting materials over which it is formed and that provides a satisfactory barrier to subsequent implantation steps). As explained above, in some embodiments, a photoresist material can be used as the protective layer 430. The protective layer 430 prevents implantation from damaging underlying conducting layers and prevents the implantation of the porosity inducing agent into the protected regions 411.

This protective layer 430 and the deposited trench material 420' and the deposited via material 42' define the porosity regions 410. The protective layer 430 and deposited trench material 420' define the underlying protected region 411. As before, the exposed porosity regions 410 can still be readily treated with ion implantation (and later made porous). FIG. 4(b) depicts this ion implantation 440 with a porosity inducing material. The implanted porosity inducing material is schematically depicted by the "X's" in the porosity regions 410.

Referring to FIG. 4(c), after implantation with the porosity inducing material, the protective layer is removed and the substrate is annealed as explained hereinabove. This leaves a resulting structure similar to that of FIGS. 2(d) and 3(c). The annealing forms micro-pores (schematically depicted by the dots) in the porosity regions 410. As explained above, the walls 411 of the via have not been implanted with a porosity inducing agent. Also, the protected region 411 underlying the deposited trench material 420' is not implanted with a porosity inducing agent. Therefore, upon annealing, neither of these regions include micro-pores. The inventors further contemplate that the protective layer 430 can be left in place after implantation and annealing if desired. In such cases, further layers can be formed over the protective layer 430. In one particular implementation, the conducting material deposited into the openings (e.g., 420', 421') can be a copper-containing material. In such cases, the protective layer 430 can be a photoresist material that is spun on and patterned using standard lithography processes known to persons having ordinary skill in the art. Also, as is known to a person having ordinary skill in the art, other materials can be used as a protective layer 430.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims,. In particular, it is contemplated by the inventors that anti-reflective coating layers disclosed herein can be practiced with a number of different materials. These anti-reflective coating layers can be formed on dielectric materials, insulating structures, conductive materials, metallization layers and many other materials. Further, reference in the claims to an element in the singular is not intended to mean "one and only one " unless explicitly stated, but rather, "one or more".

What is claimed is:

1. A method for lowered the dielectric constant in a layer of dielectric material, the method comprising:
   providing a semiconductor substrate having at least one overlaying layer that includes a layer of dielectric material formed thereon, the dielectric material having a first dielectric constant;
   implanting a portion of the dielectric layer with a porosity inducing agent to form porosity regions in the layer of dielectric material;
   annealing the semiconductor substrate to form micropores in the porosity regions, the annealed porosity regions having a second dielectric constant having a lower numerical value than a numerical value for the first dielectric constant;
   removing material from the annealed porosity regions to form openings in the dielectric layer; and
   filling the openings with conducting material.

2. A method for lowered the dielectric constant in a layer of dielectric material, the method comprising;
   providing a semiconductor substrate having at least one overlaying layer that includes a layer of dielectric material formed thereon, the dielectric material having a first dielectric constant;
   implanting a portion of the dielectric layer with a porosity inducing agent to form porosity regions in the layer of dielectric material, wherein the step of implanting a portion of the dielectric layer with a porosity inducing agent includes masking the dielectric layer with a protective layer such that openings in the protective layer define the porosity regions; and
   annealing the semiconductor substrate to form micropores in the porosity regions, the annealed porosity regions having a second dielectric constant having a lower numerical value than a numerical value for the first dielectric constant.

3. A method for lowered the dielectric constant in a layer of dielectric material, the method comprising:
   providing a semiconductor substrate having at least one overlaying layer that includes a layer of dielectric material formed thereon wherein the dielectric material has a first dielectric constant and has openings formed therein;
   filling the openings with conducting material such that the conducting material overlies portions of the dielectric layer to define underlying protected regions in the dielectric layer and wherein the portions of the dielectric layer that are between the conducting material define the porosity regions;
   implanting a portion of the dielectric layer with a porosity inducing agent to form porosity regions in the layer of dielectric material such that the implanting includes implanting only the porosity regions and not implanting the protected regions; and
   annealing the semiconductor substrate to form micropores in the porosity regions, the annealed porosity regions having a second dielectric constant having a lower numerical value than a numerical value for the first dielectric constant.

4. The method of claim 3, wherein the step of implanting a portion of the dielectric layer with a porosity inducing agent includes masking the conducting material with a protective layer arranged such that openings in the protective layer define the porosity region and protect the conducting material from the implantation.

5. The method of claim 4, wherein the step of implanting includes removing the protective layer after implantation.

6. The method of claim 4, wherein the step of implanting includes leaving the protective layer in place on the conducting material after implantation.

7. A method for lowered the dielectric constant in a layer of dielectric material, the method comprising:
   providing a semiconductor substrate having at least one overlaying layer that includes a layer of dielectric material formed thereon; the dielectric material having a first dielectric constant;
   implanting a portion of the dielectric layer with a porosity inducing agent to form porosity regions in the layer of dielectric material such that the implanting includes masking the dielectric layer with a protective layer such that openings in the protective layer define the porosity regions and the protective layer covers a protected region of the dielectric layer that protected from implantation of the porosity inducing agent by the presence of the protective layer; and
   annealing the semiconductor substrate to form micropores in the porosity regions, the annealed porosity regions having a second dielectric constant having a lower numerical value than a numerical value for the first dielectric constant.

8. A method for lowered the dielectric constant in a layer of dielectric material, the method comprising:
   providing a semiconductor substrate having at least one overlaying of dielectric material formed thereon, the dielectric material having a first dielectric constant and having openings formed therein;
   filling the openings with material arranged to overlie portions of the dielectric layer to define underlying protected regions in the dielectric layer and wherein the portions of the dielectric layer that are between the material in the openings define the porosity regions;
   implanting the dielectric layer with a porosity inducing agent such that the porosity inducing agent is implanted only into the porosity regions and not implanted into the protected regions; and
   annealing the semiconductor substrate to form micropores in the porosity regions, the annealed porosity regions having a second dielectric constant having a lower numerical value than a numerical value for the first dielectric constant.

9. The method of claim 1, wherein the step of implanting includes implanting with a porosity inducing agent that includes argon ions.

10. The method of claim 1, wherein the step of implanting includes implanting with a porosity inducing agent that is selected from among the group consisting of hydrogen, helium, argon, and nitrogen.

11. The method of claim 2, wherein the step of implanting includes implanting with a porosity inducing agent that includes argon ions.

12. The method of claim 2, wherein the step of implanting includes implanting with a porosity inducing agent that is selected from among the group consisting of hydrogen, helium, argon, and nitrogen.

13. The method of claim 3, wherein the step of implanting includes implanting with a porosity inducing agent that includes argon ions.

14. The method of claim 3, wherein the step of implanting includes implanting with a porosity inducing agent that is selected from among the group consisting of hydrogen, helium, argon, and nitrogen.

15. The method of claim 7, wherein the step of implanting includes implanting with a porosity inducing agent that includes argon ions.

16. The method of claim 7, wherein the step of implanting includes implanting with a porosity inducing agent that is selected from among the group consisting of hydrogen, helium, argon, and nitrogen.

17. The method of claim 8, wherein the step of implanting includes implanting with a porosity inducing agent that includes argon ions.

18. The method of claim 8, wherein the step of implanting includes implanting with a porosity inducing agent that is selected from among the group consisting of hydrogen, helium, argon, and nitrogen.

* * * * *